(12) United States Patent
Huang

(10) Patent No.: US 7,446,401 B2
(45) Date of Patent: Nov. 4, 2008

(54) STRUCTURE OF POWER SEMICONDUCTOR WITH TWIN METAL AND CERAMIC PLATES

(76) Inventor: Wen-Ping Huang, 5F, No. 208, Sec. 3, Chung Yang RD., Tucheng, Taupei Hsien, Taipei Hsien (TW)

( * ) Notice: Subject to any disclaimer, the term of this patent is extended or adjusted under 35 U.S.C. 154(b) by 448 days.

(21) Appl. No.: 11/264,048

(22) Filed: Nov. 2, 2005

(65) Prior Publication Data
US 2007/0096276 A1  May 3, 2007

(51) Int. Cl.
*H01L 23/02* (2006.01)
(52) U.S. Cl. .......................... 257/678; 257/690
(58) Field of Classification Search ................ 257/678
See application file for complete search history.

(56) References Cited

U.S. PATENT DOCUMENTS

2005/0035442 A1*  2/2005  Gerbsch et al. ............. 257/690

* cited by examiner

*Primary Examiner*—Thien F Tran
(74) *Attorney, Agent, or Firm*—Bacon & Thomas PLLC

(57) ABSTRACT

A designing for a power semiconductor, and especially to a structure of a power semiconductor formed by using the basic materials including two metal plates and a ceramic plate, in the power semiconductor, mainly surfaces of the ceramic base plate provided with a receiving groove is metallized, and the metallic base plates having electric connecting pins extending outwards therefrom are placed at the two lateral sides of the ceramic base plate, then a chip is placed in the receiving groove of the ceramic base plate, and the ceramic base plate is sintered together with the two metallic base plates, thus the structure of the power semiconductor with the twin metal plates and the ceramic plate is formed.

6 Claims, 7 Drawing Sheets

STRUCTURE OF POWER SEMICONDUCTOR WITH TWIN METAL AND CERAMIC PLATES

BACKGROUND OF THE INVENTION

1. Field of the Invention

The present invention is related to designing for a power semiconductor, and especially to a power semiconductor formed by using the basic materials including two metal plates and a ceramic plate.

2. Description of the Prior Art

The traces of electric power and electron can be seen in the fields of utility in industry, power systems, traffic, commerce, aviation, computer communication and military affairs, in the field of electric power and electron, power semiconductor elements are often used to achieve various requirements. As shown in FIG. 1 which is a schematic view of a normal structure of power semiconductor, the power semiconductor is provided therein with a silicon chip 10 made of silicon (or germanium), the silicon chip 10 has electric connecting pins 11 extending outwards therefrom, and is sealed with a non electric conductive epoxy resin layer 20 (called as sealing or pouring of plastic), and the electric connecting pins 11 are used to form connecting of the entire power semiconductor with an electric circuit.

In practical operation of the power semiconductor, high temperature can be generated to thereby influence the state of operation of the power semiconductor; and thereby a normal power semiconductor is provided in advance with a copper made heat conducting plate 30 on an surface of the epoxy resin layer 20, the heat conducting plate 30 is contacted with the silicon chip 10, the conducting plate 30 can increase the heat exchange rate with air, so that an object of reducing the temperature of the power semiconductor can be achieved.

However, when the heat generated in operation of the power semiconductor is transmitted to the outer epoxy resin layer 20, by virtue that the epoxy resin layer 20 has inferior heat conductivity, after using for a long period, the epoxy resin layer 20 will absorb heat energy and store/seal the heat energy which is hard to dissipate in the power semiconductor; this is subjected to inducing overheating of the power semiconductor that renders the latter unable to operate normally, and thereby reduces the life of use of the power semiconductor.

The heat conductivity of a normal epoxy resin layer 20 is 0.0032, as to the heat conductivity of a kind of non electric conductive material, the material of the normal epoxy resin layer 20 is not excellent in its efficiency of heat conducting; in other words, when the amount of heat generated by the silicon chip 10 is constant, the heat conducting efficiency of the power semiconductor is changed in dependence on the volume of the epoxy resin layer 20 and that of the heat conducting plate 30; if the epoxy resin is substituted by ceramic (the heat conductivity of the ceramic is about 25 times of that of the epoxy resin), the efficiency of heat conducting can be increased, and the power semiconductor is easier to scatter heat.

More over, if the epoxy resin is substituted by ceramic, the ceramic can be shaped firstly and then combined with metallic heat conducting plates by a high temperature sintering technique; in this way, the process of manufacturing can be different from the conventional one which needs complicated process and equipment for plastic sealing (called as sealing or pouring of plastic), the process of manufacturing can be simplified, and the efficiency of automation production can thus be increased.

Additionally, the above stated conventional power semiconductor scatters heat by means of a single exposed heat conducting plate 30, if two mutual opposite sides of the power semiconductor are provided each with a heat conducting plate, the area of heat sinking can be increased to twofold, thus the efficiency of heat sinking can be largely increased.

SUMMARY OF THE INVENTION

Therefore, in view of the above significant defects resided in the efficiency of heat sinking as well as the process of manufacturing in using an epoxy resin layer to seal the conventional power semiconductor, the inventor of the present invention successfully developed a structure and a manufacturing method of a power semiconductor with twin metal plates and a ceramic plate based on his professional experience of years in studying, designing and manufacturing same kind of products and after hard study and developing.

Therefore, in "the structure of manufacturing a power semiconductor with twin metal plates and a ceramic plate", mainly surfaces of a ceramic base plate provided with a receiving groove is metallized, and two metallic base plates having electric connecting pins extending outwards there from are placed at the two lateral sides of the ceramic base plate, then a chip is placed in the receiving groove of the ceramic base plate, and the ceramic base plate is sintered together with the two metallic base plates, thus the structure of the power semiconductor with the twin metal plates and the ceramic plate is formed.

The object of the present invention is: to make the heat generated in operation of the silicon chip (when electric current passes through the two metallic base plates) be fast transmitted to the two metallic base plates through the ceramic base plate by having the surfaces of the ceramic base plate metallized and the two lateral sides of the ceramic base plate combined with the two metallic base plates all by a high temperature sintering technique. In comparison with the structure of the conventional power semiconductor, the heat conductivity of the ceramic base plate of the present invention is better than that of the epoxy resin layer, the amount of the heat stored and sealed can be largely reduced, and the area of heat sinking of the two metallic base plates can be increased at least to twofold of that of the conventional power semiconductor, thus the power semiconductor with twin metal plates and a ceramic plate sintered together of the present invention can be used for a long period in a high temperature environment, and thereby the life of use of the power semiconductor can be increased.

Another object of the present invention is to render the process of manufacturing simplified and the efficiency of automation production increased by having the ceramic shaped firstly and then combined with the metallic heat conducting plates by a high temperature sintering technique (in this way, the process of manufacturing can be different from the conventional one and needs no complicated process and equipment for plastic sealing).

The present invention will be apparent in its content and the effect to be achieved after reading the detailed description of the preferred embodiment thereof in reference to the accompanying drawings.

DETAILED DESCRIPTION OF THE PREFERRED EMBODIMENT

Figure 1:
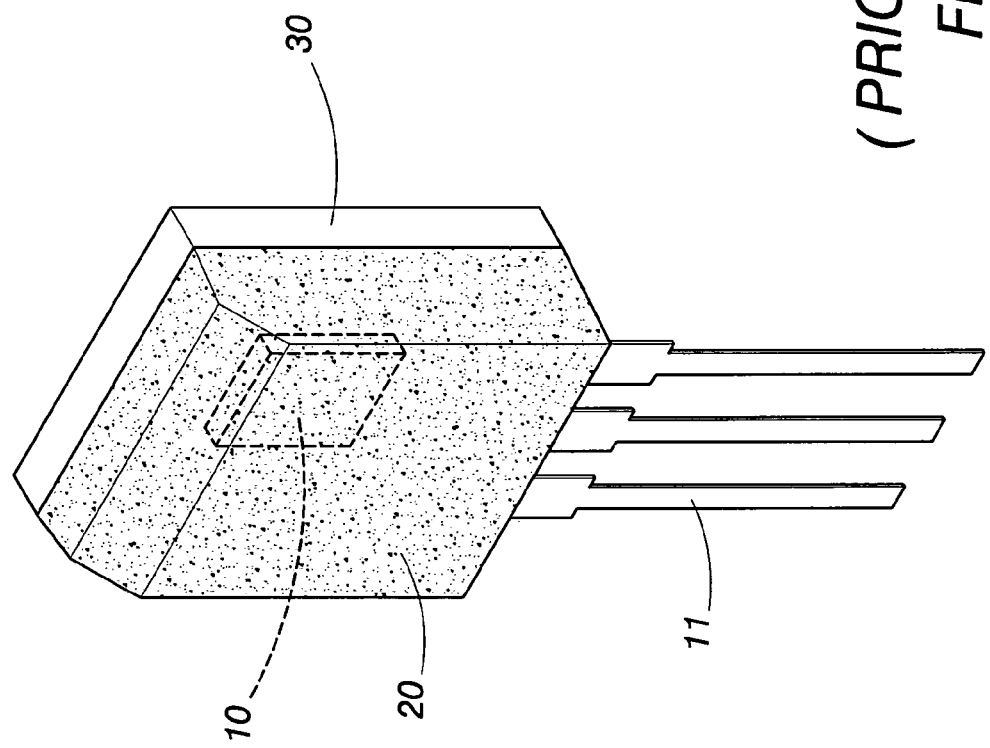
FIG. 1 is a perspective schematic view showing a conventional power semiconductor.
Figure 2:
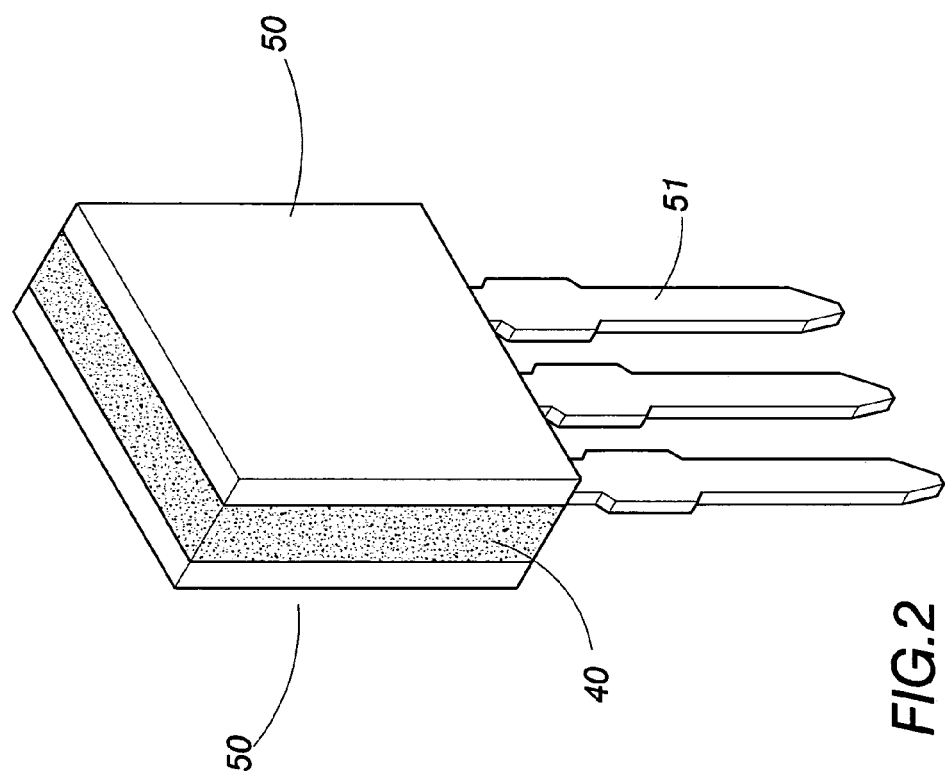
FIG. 2 is perspective schematic view of the present invention.
Figure 3:
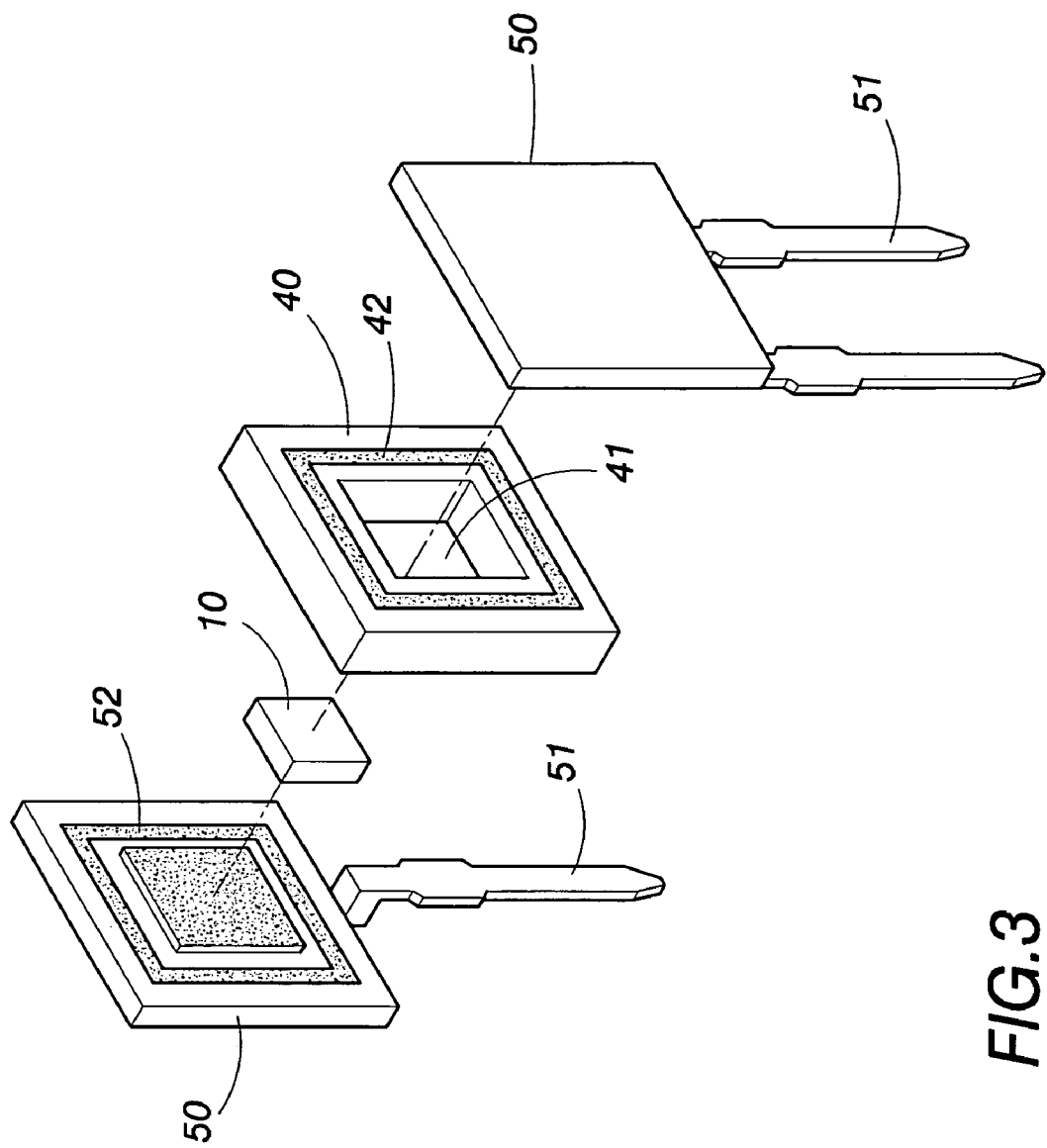
FIG. 3 is an anatomic perspective schematic view of the present invention.
Figure 4:
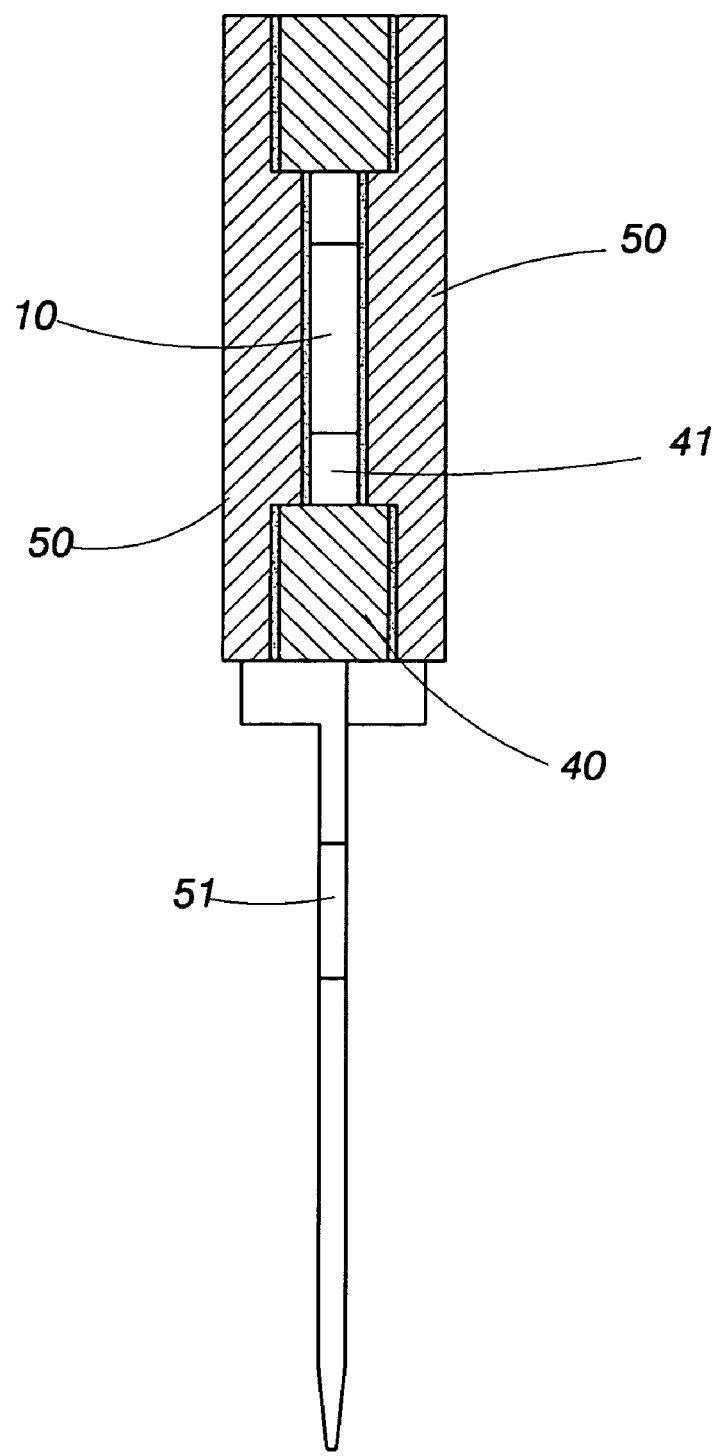
FIG. 4 is a sectional schematic view of the present invention.

Referring to FIGS. 2-4, in "the structure and the method of manufacturing a power semiconductor with twin metal plates and a ceramic plate" of the present invention, the power semiconductor mainly is composed of a silicon chip 10, a ceramic base plate 40 and two metallic base plates 50, wherein the ceramic base plate 40 is provided with a receiving groove 41 to receive the silicon chip 10; the two lateral sides of the ceramic base plate 40 are combined with the two metallic base plates 50 by a high temperature sintering technique, thereby the silicon chip 10 is contacted and electrically communicated with the two metallic base plates 50, and the two metallic base plates 50 have connecting pins 51 extending outwards therefrom, and the structure of the power semiconductor with the twin metal plates and the ceramic plate thus is formed.

In using the power semiconductor with the twin metal plates and the ceramic plate, because that heat can be generated when electric current passes through the connecting pins 51 and the silicon chip 10 between the two metallic base plates 50 is operated, heat energy can be transmitted to two metallic base plates 50 through the ceramic base plate 40 sintered between the two metallic base plates 50, and the two metallic base plates 50 can do heat exchange with air.

The heat conductivity of the ceramic base plate 40 is about 0.078, in comparison with that of a conventional epoxy resin layer (the heat conductivity of the conventional epoxy resin layer is 0.0032), the heat conductivity of the ceramic base plate 40 is 24.375 times of that of the conventional epoxy resin layer; in view of this, the power semiconductor of the present invention can get increased efficiency of heat conducting by using the ceramic base plate 40, the amount of the heat stored and sealed in the ceramic base plate 40 can be largely reduced, and the area of heat exchange of the whole power semiconductor with air can be increased by using the two metallic base plates 50, this can largely increase the efficiency of heat conducting and heat sinking, thus the power semiconductor with twin metal plates and a ceramic plate sintered together of the present invention can be used for a long period in a high temperature environment, and thereby the life of use of the power semiconductor can be increased.

Figure 5:
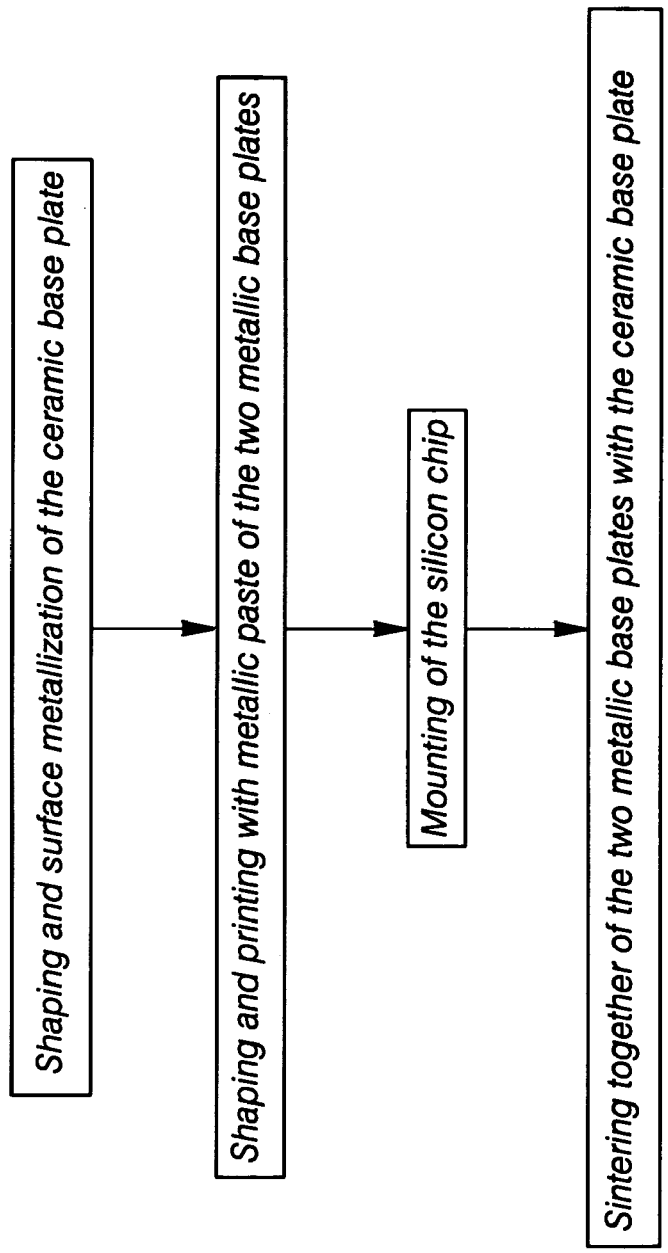
FIG. 5 is a process flow chart showing the manufacturing process of the present invention.

Referring to FIGS. 3 and 5, the manufacturing method of the power semiconductor with the twin metal plates and the ceramic plate includes the following steps:

1. Shaping and surface metallization of the ceramic base plate 40: the ceramic base plate 40 at least is provided with a receiving groove 41, and surfaces of the ceramic base plate 40 are metallized for combining with the two metallic base plates 50.

2. Shaping and printing with metallic paste of the two metallic base plates 50: the metallic base plates 50 can be provided with required connecting pins 51, and have their surfaces printed with metallic paste 52; preferably the metallic paste 52 is tin paste, while the connecting pins 51 can be of a straight or bending type, what depicted in the drawings are of the straight type.

3. Mounting of the silicon chip 10: the silicon chip 10 is mounted on one of the metallic base plates 50, subsequently, the ceramic base plate 40 and the other metallic base plate 50 are allocated to render the silicon chip 10 located in the receiving groove 41 of the ceramic base plate 40.

4. Sintering together of the two metallic base plates 50 with the ceramic base plate 40: the two metallic base plates 50 are fixed on the two lateral sides of the ceramic base plate 40, their sintering temperature is about 350-400° C., hence the silicon chip 10 can be combined with the two lateral sides of the ceramic base plate 40, and the structure of the power semiconductor with the twin metal plates and the ceramic plate is formed.

Figure 6:
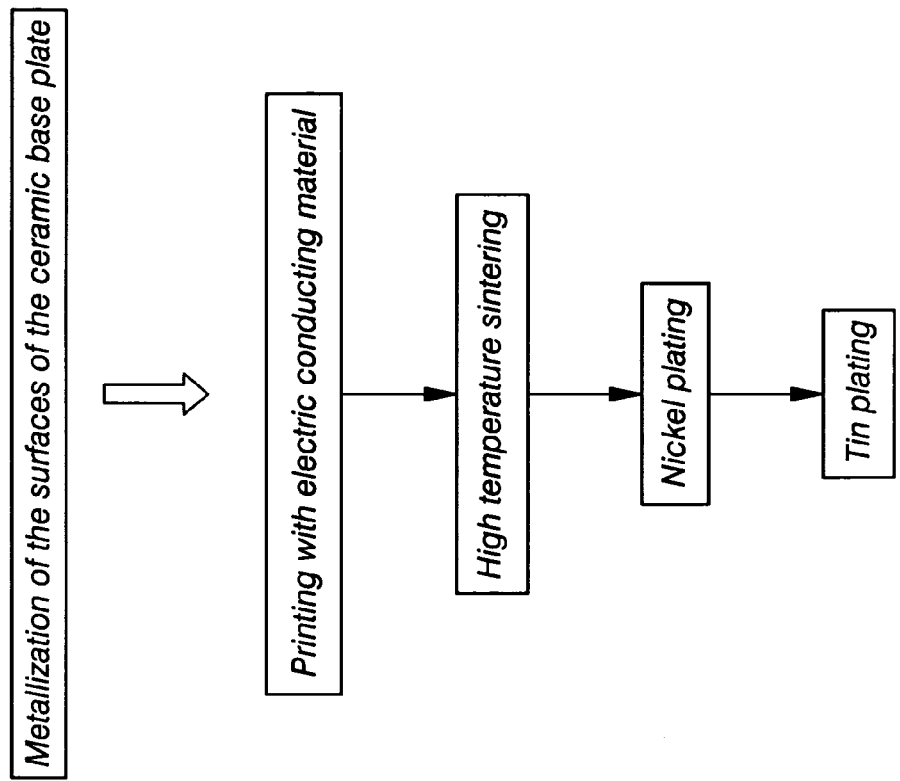
FIG. 6 is a process flow chart showing the manufacturing process for metallization of the surfaces of the ceramic base plate of the present invention.

In the above manufacturing process, the method of metallization of the surfaces of the ceramic base plate 40 as shown in FIG. 6 further includes the following steps:

1. Printing with electric conducting material: a screen printing technique is practiced on the ceramic base plate 40 using electric conductive paste 42 made by mixing of silver glue and glass etc., such as is shown in FIG. 3.

2. High temperature sintering: the electric conductive paste 42 is combined with the ceramic base plate 40 by sintering under a high temperature in the range of 600-800° C.

3. Nickel plating: this is to prevent breaking loose of the electric conductive paste 42.

4. Tin plating: the ceramic base plate 40 is sintered in the high temperature together with the two metallic base plates 50.

In all the drawings, by virtue that the power semiconductor of the present invention uses the ceramic base plate 40 and the metallic base plates 50 to seal up the silicon chip 10, and the heat conductivity of the ceramic base plate 40 is 24.375 times of that of the conventional epoxy resin layer, and the two lateral sides of the ceramic base plate 40 are combined with the two metallic base plates 50, thereby the heat generated in operation of the silicon chip 10 can be fast transmitted to the two metallic base plates 50 through the ceramic base plate 40; and the area of heat exchange through the two metallic base plates 50 with air can be increased, and thereby the life of use of the power semiconductor with the twin metal plates 50 and the ceramic plate 40 can be increased, and the power semiconductor can be used for a long period in a high temperature environment.

One thing is worth mentioning, the ceramic base plate 40 can have any of various thicknesses and sizes in pursuance of different requirements of electric current; when the electric current passes through the two metallic base plates 50 to render the silicon chip 10 to generate heat energy during operating, the heat energy is stored/sealed by the ceramic base plate 40 having one of various thicknesses and sizes, and the ceramic base plate 40 can have the heat energy released by the two metallic base plates 50, thereby the power semiconductor with the twin metal plates 50 and the ceramic plate 40 can be used for a long period in a high temperature environment; and the life of use of the power semiconductor can be increased.

In order to specify that the efficiency of heat conducting of the present invention is better than that of the conventional power semiconductor, the followings is a comparison of the efficiency of heat conducting of the present invention with the above stated conventional power semiconductor having an epoxy resin layer:

1. As stated above, the heat conductivity of the conventional epoxy resin layer is 0.0032, while the heat conductivity of the ceramic base plate 40 is 0.078; hence the heat conductivity of the ceramic base plate 40 is 24.375 times of that of the conventional epoxy resin layer.
2. The two metallic base plates 50 are provided on the two lateral sides of the ceramic base plate 40, the heat energy stored and sealed in the ceramic base plate 40 can thus be led to the two lateral metallic base plates 50; this can increase the heat exchange area of the whole power semiconductor with air.
3. By the fact that the heat conductivity of the ceramic base plate 40 is 24.375 times of that of the conventional epoxy resin layer, the larger the volume of the ceramic base plate 40 is, the better the efficiency of heat conducting will be.

In view of this, it is evident that, with the same volume, the present invention surely has better efficiency of heat conducting than that of the conventional power semiconductor with the epoxy resin layer.

In addition to the above stated advantages, in manufacturing the present invention, ceramic is shaped firstly and then combined with the metallic heat conducting plates by a high temperature sintering technique; in this way, the process of manufacturing can be different from the conventional one and needs no complicated process and equipment for plastic sealing. The process of manufacturing can thus be simplified and the efficiency of automation production can be increased.

Figure 7:
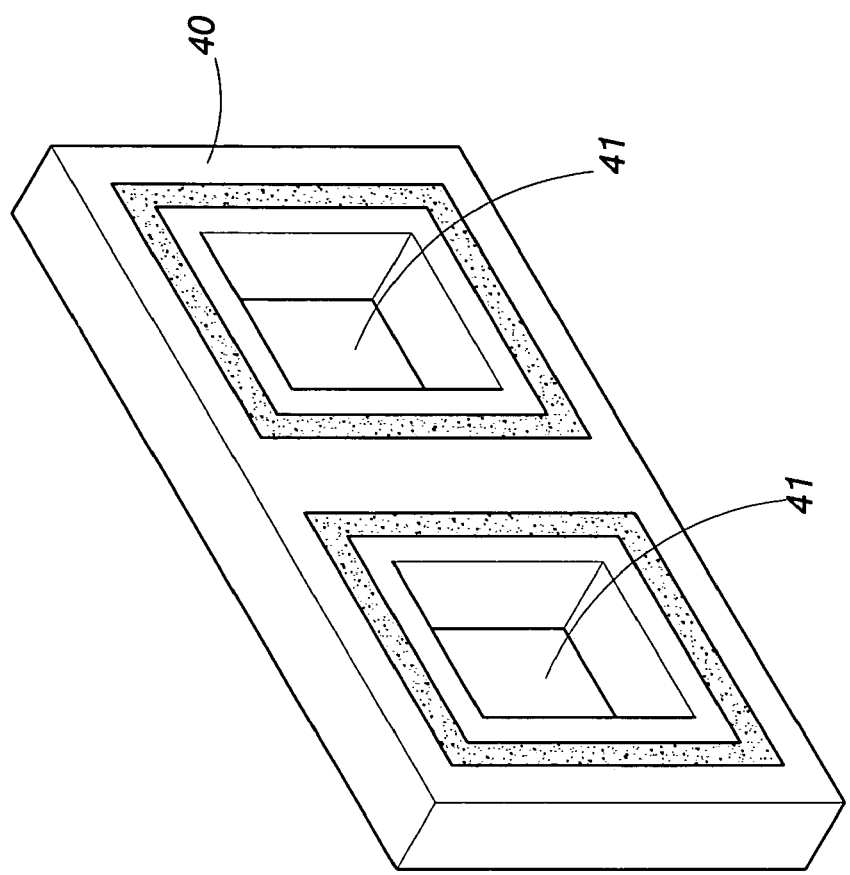
FIG. 7 is a perspective schematic view showing a second embodiment of the ceramic base plate of the present invention.

And more, as shown in FIG. 7, in practicing the present invention, the ceramic base plate 40 is further provided with two receiving grooves 41, so that the ceramic base plate 40 can have two silicon chips placed respectively in these receiving grooves 41, and a power semiconductor with twin chips can be formed.

The names of the members composing the present invention and the shape shown in the drawings are only for illustrating a preferred embodiment of the present invention, and not for giving any limitation to the scope of the present invention. It will be apparent to those skilled in this art that various equivalent modifications or changes without departing from the spirit of this invention shall also fall within the scope of the appended claims.

The invention claimed is:

1. A structure of a power semiconductor with twin metallic base plates and a ceramic base plate, said power semiconductor is composed of a silicon chip, a ceramic base plate and two metallic base plates, wherein said ceramic base plate is provided at least with a receiving groove to receive said silicon chip; two lateral sides of said ceramic base plate are combined with said two metallic base plates by a high temperature sintering technique, thereby said silicon chip is contacted and electrically communicated with said two metallic base plates, and said two metallic base plates have connecting pins extending outwards therefrom, and said structure of said power semiconductor with said twin metal plates and said ceramic plate thus is formed.

2. The structure of a power semiconductor with twin metallic base plates and a ceramic base plate as in claim 1, wherein: said metallic base plates are made of copper.

3. The structure of a power semiconductor with twin metallic base plates and a ceramic base plate as in claim 1, wherein: said connecting pins of said two metallic base plates are of a type at least chosen from a straight and a bending type.

4. The structure of a power semiconductor with twin metallic base plates and a ceramic base plate as in claim 1, wherein: said two metallic base plates have their surfaces in combining with said two metallic base plates printed with metallic paste in advance.

5. The structure of a power semiconductor with twin metallic base plates and a ceramic base plate as in claim 1, wherein: said two lateral sides of said ceramic base plate are respectively sintered together with said two metallic base plates at a high temperature after being treated with a method of metallization.

6. The structure of a power semiconductor with twin metallic base plates and a ceramic base plate as in claim 5, wherein: said method of said metallization of said surfaces of said ceramic base plate includes following steps:
   1) printing on said ceramic base plate with said electric conductive paste made by mixing of silver glue and glass;
   2) high temperature sintering to combine said electric conductive paste with said ceramic base plate;
   3) nickel plating used to prevent breaking loose of said electric conductive paste;
   4) tin plating to render said ceramic base plate to be sintered together with said metallic base plates.

* * * * *